(12) United States Patent
Yano et al.

(10) Patent No.: US 9,969,652 B2
(45) Date of Patent: May 15, 2018

(54) SINTERED BODY

(71) Applicant: NIPPON YTTRIUM CO., LTD., Omuta-shi, Fukuoka (JP)

(72) Inventors: Toyohiko Yano, Tokyo (JP); Katsumi Yoshida, Tokyo (JP); Toru Tsunoura, Tokyo (JP); Yuji Shigeyoshi, Omuta (JP)

(73) Assignee: NIPPON YITRIUM CO., LTD., Omuta-Shi (JP)

( * ) Notice: Subject to any disclaimer, the term of this patent is extended or adjusted under 35 U.S.C. 154(b) by 0 days. days.

(21) Appl. No.: 15/510,136

(22) PCT Filed: Nov. 18, 2015

(86) PCT No.: PCT/JP2015/082452
§ 371 (c)(1),
(2) Date: Mar. 9, 2017

(87) PCT Pub. No.: WO2016/080459
PCT Pub. Date: May 26, 2016

(65) Prior Publication Data
US 2017/0305796 A1  Oct. 26, 2017

(30) Foreign Application Priority Data
Nov. 21, 2014  (JP) .................................. 2014-236303

(51) Int. Cl.
*C04B 35/50* (2006.01)
*C04B 35/645* (2006.01)
(Continued)

(52) U.S. Cl.
CPC ............ *C04B 35/50* (2013.01); *C04B 35/645* (2013.01); *H01J 37/32495* (2013.01);
(Continued)

(58) Field of Classification Search
CPC .............................. C04B 35/50; C04B 35/505
See application file for complete search history.

(56) References Cited

U.S. PATENT DOCUMENTS 7,744,780 B2 *  6/2010  Kobayashi ............ C04B 35/505
                                                        252/516
7,833,924 B2 * 11/2010  Kobayashi ............ C04B 35/505
                                                        501/152
(Continued)

FOREIGN PATENT DOCUMENTS

CN          101605736 A      12/2009
JP          2000-219574 A    8/2000
(Continued)

OTHER PUBLICATIONS

Internatinal Search Report, issued in PCT/JP2015/082452, dated Jan. 19, 2016.
(Continued)

*Primary Examiner* — Karl E Group
(74) *Attorney, Agent, or Firm* — Birch, Stewart, Kolasch & Birch, LLP

(57) ABSTRACT

A sintered body of the present invention contains yttrium oxyfluoride. The yttrium oxyfluoride is preferably YOF and/or $Y_5O_4F_7$. The sintered body of the present invention preferably contains 50% by mass or more of yttrium oxyfluoride. The sintered body of the present invention has a relative density of preferably 70% or more and an open porosity of preferably 10% or less. Furthermore, the sintered body of the present invention has a three-point bending strength of preferably 10 MPa or more and 300 MPa or less.

8 Claims, 12 Drawing Sheets

(51) Int. Cl.
*H01J 37/32* (2006.01)
*H01L 21/67* (2006.01)

(52) U.S. Cl.
CPC ............ *C04B 2235/445* (2013.01); *C04B 2235/5436* (2013.01); *C04B 2235/604* (2013.01); *C04B 2235/656* (2013.01); *C04B 2235/9692* (2013.01); *H01J 2237/334* (2013.01); *H01L 21/67069* (2013.01)

(56) References Cited

U.S. PATENT DOCUMENTS

| | | | |
|---|---|---|---|
| 8,025,094 B2 | 9/2011 | Janz et al. | |
| 8,372,769 B2 | 2/2013 | Janz et al. | |
| 9,017,765 B2 * | 4/2015 | Sun | H01J 37/32477 427/376.1 |
| 9,388,485 B2 * | 7/2016 | Fukagawa | C23C 4/10 |
| 2008/0226894 A1 | 9/2008 | Kobayashi et al. | |
| 2009/0200523 A1 | 8/2009 | Kobayashi et al. | |
| 2010/0043999 A1 | 2/2010 | Janz et al. | |
| 2010/0129670 A1 | 5/2010 | Sun et al. | |
| 2011/0294651 A1 | 12/2011 | Janz et al. | |
| 2015/0096462 A1 | 4/2015 | Fukagawa et al. | |

FOREIGN PATENT DOCUMENTS

| | | |
|---|---|---|
| JP | 2000-239067 A | 9/2000 |
| JP | 2008-255001 A | 10/2008 |
| JP | 2009-215154 A | 9/2009 |
| JP | 2011-136877 A | 7/2011 |
| JP | 2012-506664 A | 4/2012 |
| JP | 2013-144622 A | 7/2013 |
| JP | 2014-109066 A | 6/2014 |
| WO | WO 2014/002580 A1 | 1/2014 |

OTHER PUBLICATIONS

Yoshida et al., "Fabrication and characterization of YOF ceramics", The Ceramic Society of Japan Nenkai Koen Yokoshu, Mar. 6, 2015, 2015 Nen Nenkai, p. 2C33.

* cited by examiner

Example 3

Example 4

Fig. 5
Example 2
Before irradiation
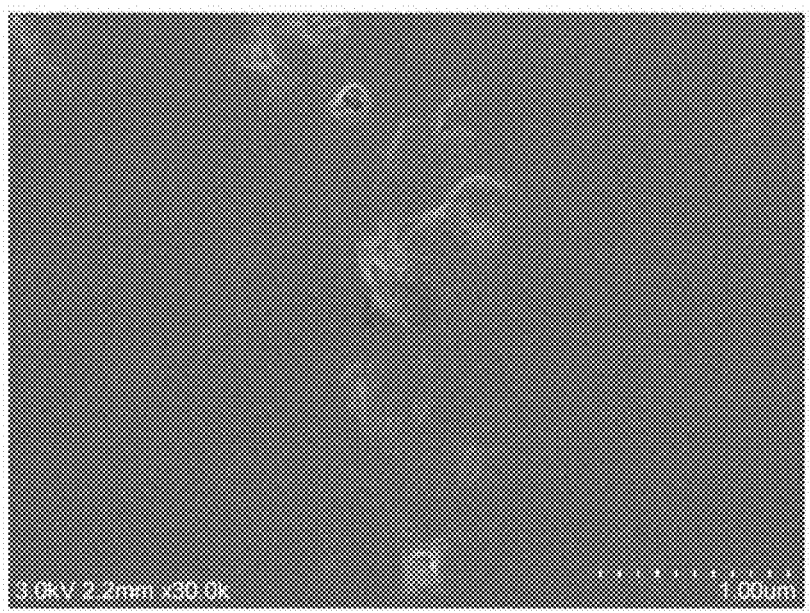
After irradiation
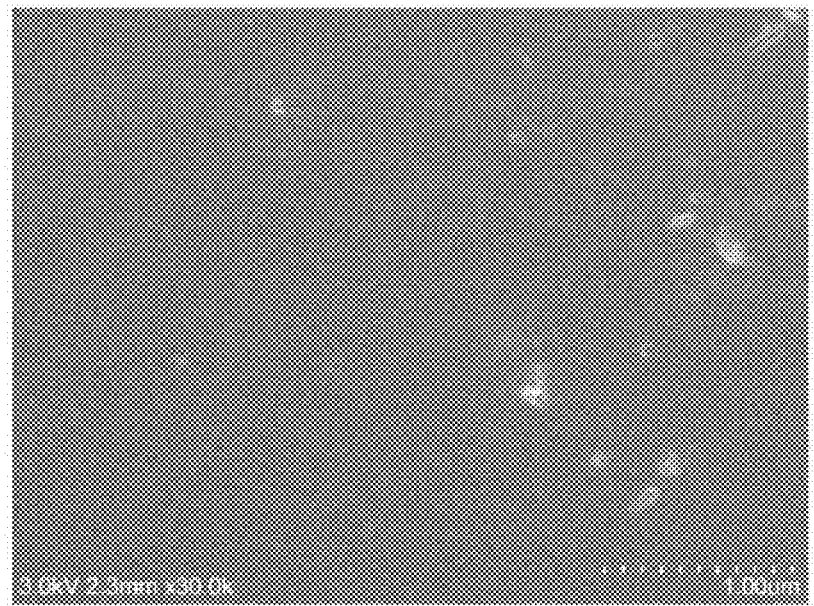

Fig. 6
Comparative Example 1 (Single Crystal silicon)
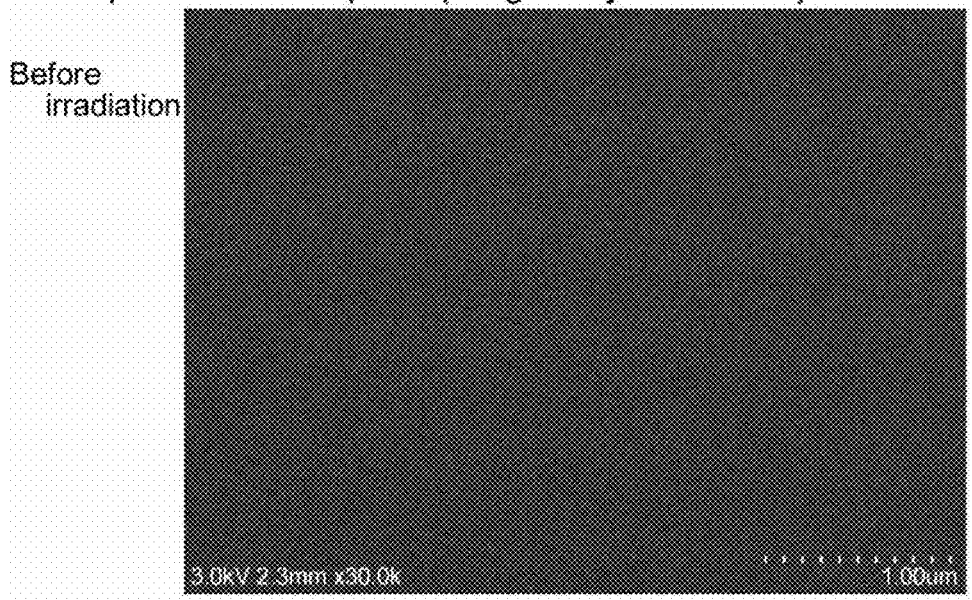
Before irradiation
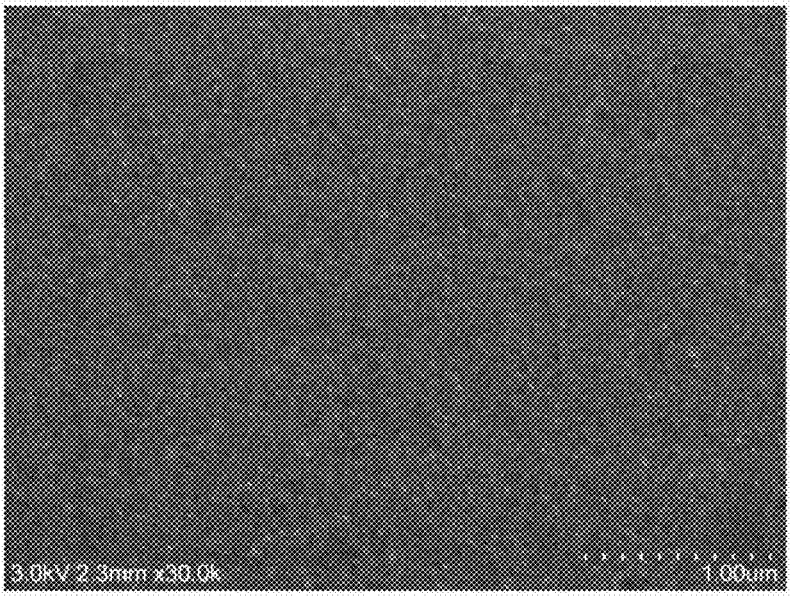
After irradiation

Fig. 8
Comparative Example 3 (Yttria)
Before irradiation
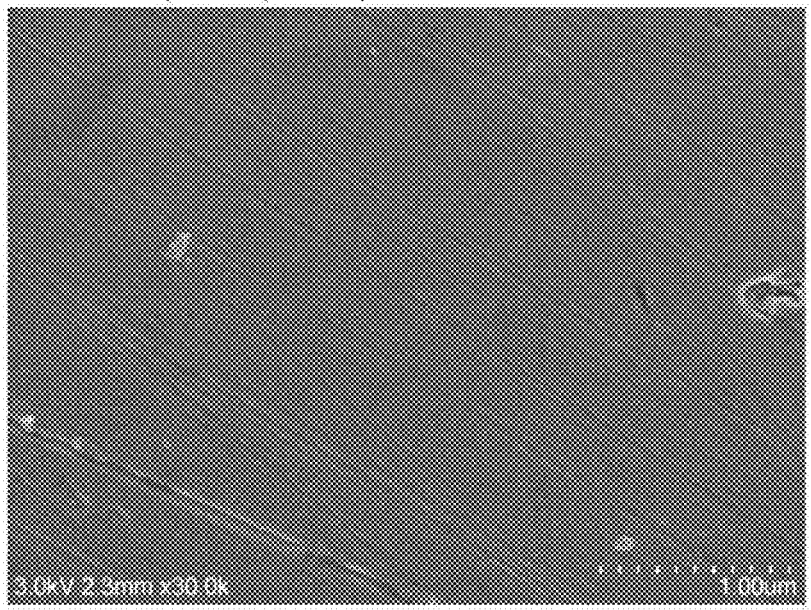
After irradiation
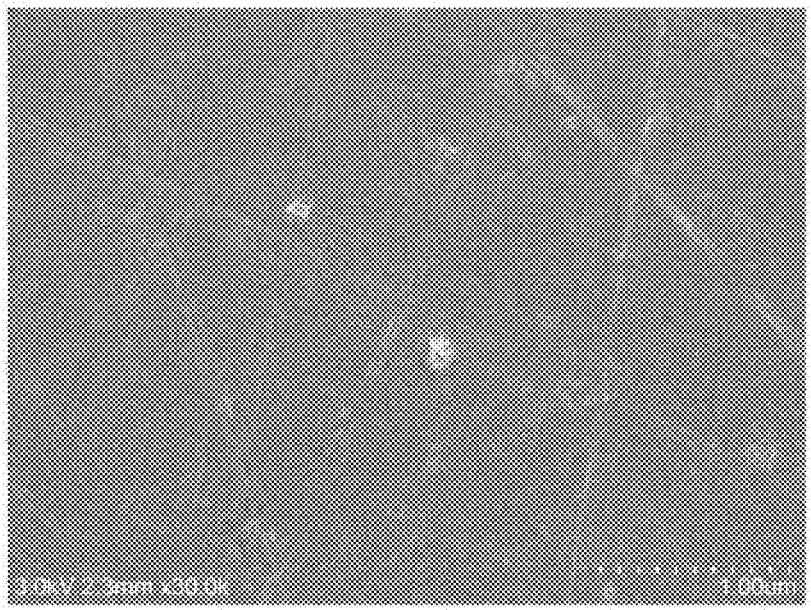

Comparative Example 4 (Yttrium fluoride)
Before irradiation
After irradiation

Fig. 11
Example 2
SEM image
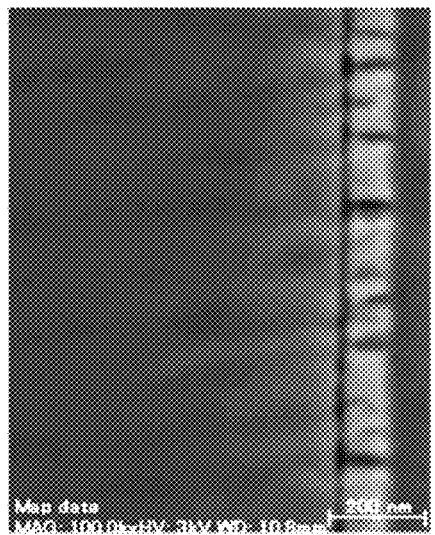
Fluorine
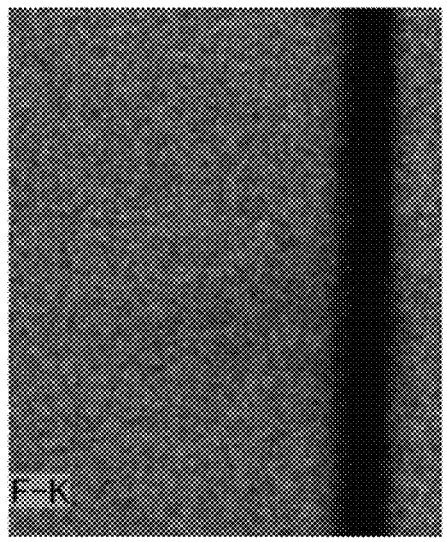
Platinum + Fluorine
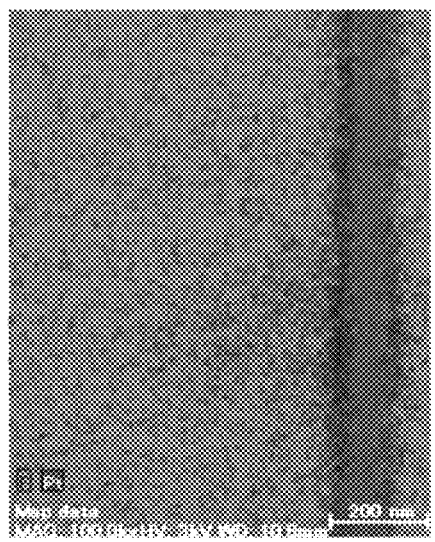
Platinum
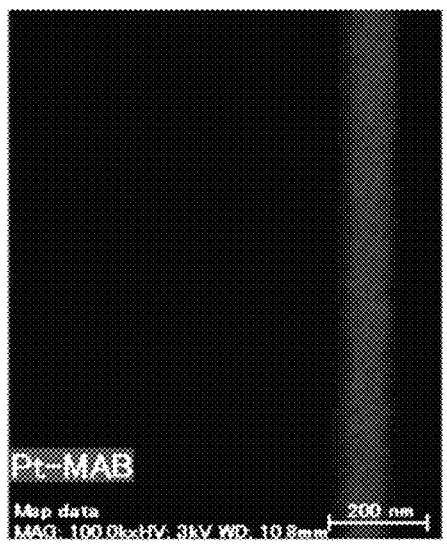

Fig. 12
Comparative Example 3 (Yttria)
SEM image 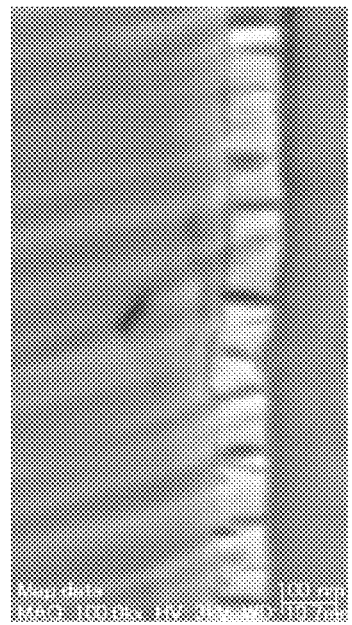
Fluorine 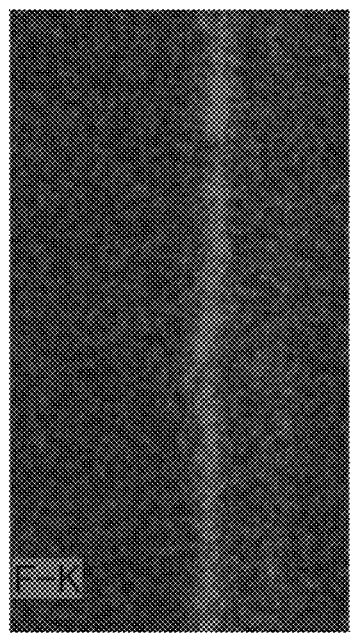
Platinum + Fluorine 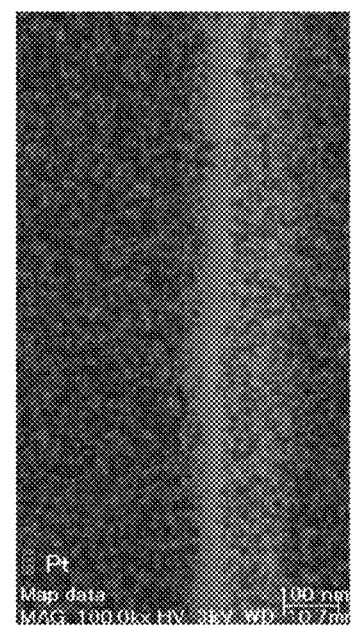
Platinum 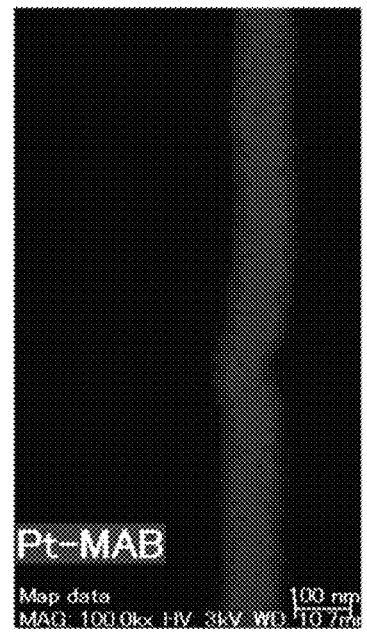

SINTERED BODY

TECHNICAL FIELD

The present invention relates to a sintered body containing yttrium oxyfluoride.

BACKGROUND ART

In semiconductor manufacturing processes, especially in dry etching, plasma etching, and cleaning processes, fluorine-based corrosive gas, chlorine-based corrosive gas, and plasma using these sorts of gas are used. Such corrosive gas or plasma corrodes constituent members of a semiconductor manufacturing apparatus, and very fine particles (particles) that fall off the surface of the constituent members are attached to semiconductor surfaces, which may cause product failures. Accordingly, for the constituent members of the semiconductor manufacturing apparatus, it is necessary to use a ceramic having high corrosion resistance against halogen-based plasma, as the bulk material.

Examples of the materials currently used as such a bulk material include aluminum oxide, yttrium oxide, aluminum yttrium complex oxide, and yttrium fluoride (see Patent Literatures 1 to 3).

To date, the present applicant has proposed a thermal spray material containing yttrium oxyfluoride, as an anti-corrosion material used for preventing corrosion of an etching apparatus (Patent Literature 4).

CITATION LIST

Patent Literatures

Patent Literature 1: JP 2011-136877A
Patent Literature 2: JP 2013-144622A
Patent Literature 3: JP 2000-219574A
Patent Literature 4: JP 2014-109066A

SUMMARY OF INVENTION

Technical Problem

There are concerns that aluminum-containing compounds such as aluminum oxide will cause aluminum contamination in semiconductor silicon. It is found that the plasma resistance of yttrium oxide is insufficient, and, when yttrium oxide is irradiated with fluorine-based plasma, the surface thereof is affected to form yttrium fluoride ($YF_3$). Since yttrium fluoride is fluoride, it may be chemically unstable.

Furthermore, when yttrium oxyfluoride is used as a thermal spray material to coat the interior of the semiconductor apparatus, the denseness of the obtained coating film is limited, and the properties for blocking halogen-based corrosive gas cannot be said to be sufficient.

Accordingly, the present invention provides a sintered body that solves the above-described various disadvantages of conventional techniques.

Solution to Problem

The present invention provides a sintered body containing yttrium oxyfluoride.

The present invention further provides a method for manufacturing the sintered body, including: a step of obtaining a compact of a starting material powder containing yttrium oxyfluoride; and a step of sintering the compact under a pressure of 5 MPa or more and 100 MPa or less at a temperature of 800° C. or more and 1800° C. or less, thereby obtaining the sintered body.

The present invention further provides a method for manufacturing the sintered body, including: a step of obtaining a compact of a starting material powder containing yttrium oxyfluoride; and a step of sintering the compact with no application of pressure at a temperature of 1000° C. or more and 2000° C. or less.

Advantageous Effects of Invention

The sintered body of the present invention has excellent resistance against halogen-based plasma, and is useful as a material for forming a semiconductor manufacturing apparatus such as an etching apparatus. Also, with the method for manufacturing a sintered body of the present invention, a dense sintered body as the sintered body of the present invention can be efficiently manufactured.

BRIEF DESCRIPTION OF DRAWINGS

FIG. 5 shows SEM photographs before and after plasma irradiation on the sintered body obtained in Example 2.

FIG. 6 shows SEM photographs before and after plasma irradiation on single crystal silicon of Comparative Example 1.

FIG. 8 shows SEM photographs before and after plasma irradiation on yttria of Comparative Example 3.

FIG. 11 is a cross-sectional SEM photograph and element distribution maps after plasma irradiation on the sintered body obtained in Example 2.

FIG. 12 is a cross-sectional SEM photograph and element distribution maps after plasma irradiation on the sintered body obtained in Comparative Example 3.

DESCRIPTION OF EMBODIMENTS

Figure 1:
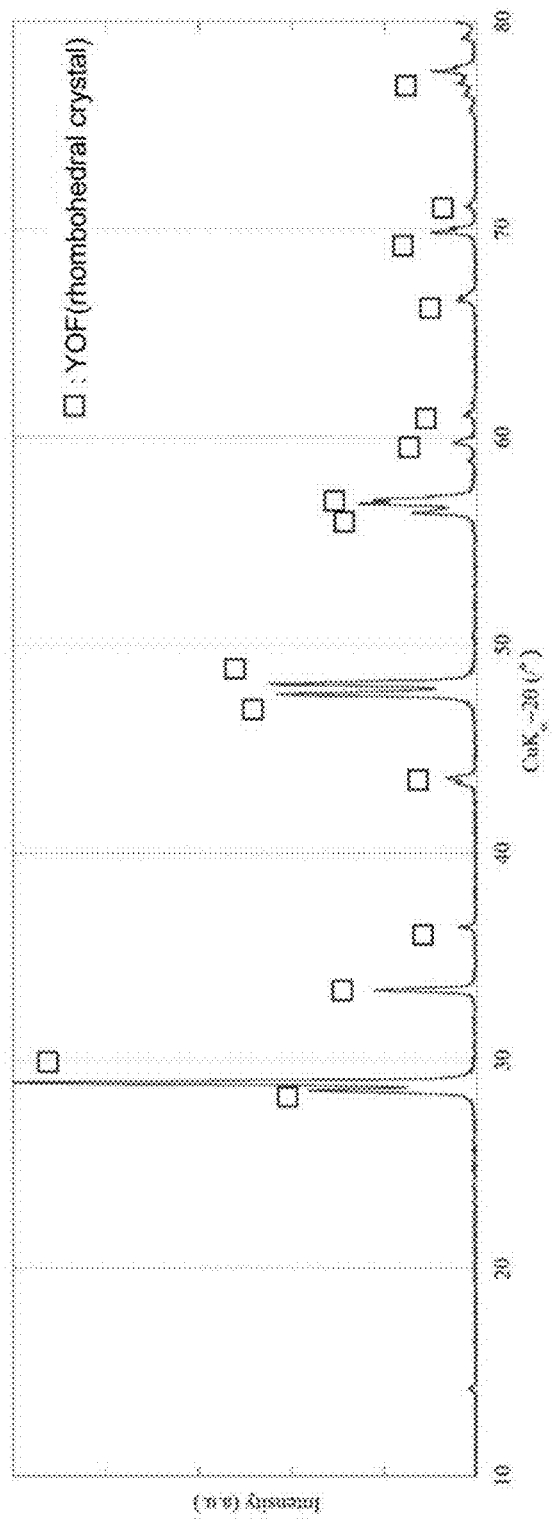
FIG. 1 is an X-ray chart obtained by powder XRD diffraction measurement of a sintered body obtained in Example 1.

Hereinafter, the present invention will be described by way of preferable embodiments. In one aspect, the sintered body of the present invention is characterized by containing yttrium oxyfluoride. The yttrium oxyfluoride in the present invention is a compound containing yttrium (Y), oxygen (O), and fluorine (F).

The yttrium oxyfluoride may be a compound in which a molar ratio between yttrium (Y), oxygen (O), and fluorine (F) is Y:O:F=1:1:1. Alternatively, the yttrium oxyfluoride may be a compound in which the molar ratio is not Y:O:

F=1:1:1. Examples of such a compound include $Y_5O_4F_7$, $Y_7O_6F_9$, and the like, and the compound contains one or more of these types of oxyfluoride. They can be used alone or in a combination of two or more. In the present invention, it is preferable to use a compound in which the molar ratio is Y:O:F=1:X:3−2X (X is 0.5 to 1.2), and particularly preferable to use YOF or $Y_5O_4F_7$.

Use of YOF is advantageous in that a sintered body having excellent mechanical strength is obtained, a dense sintered body free from cracks is obtained, and the corrosion resistance is excellent compared with that in other compositions, for example. Also, use of $Y_5O_4F_7$ is advantageous in that a dense sintered body free from cracks is obtained at a low temperature, and the corrosion resistance is improved because YOF is generated after oxidation, for example.

In the present invention, the yttrium oxyfluoride is formed not into a thermal spray material but into a sintered body, so that the properties for blocking halogen-based corrosive gas can be made high. If the yttrium oxyfluoride is used as a thermal spray material, particles forming the thermal spray material are dissolved during thermal spray and laid over each other to form a thermal spray film, but, in this case, very small gaps may be formed between the dissolved particles and halogen-based corrosive gas may flow therethrough. On the other hand, a sintered body has high denseness and excellent properties for blocking halogen-based corrosive gas, and thus if it is used to form a constituent member of a semiconductor apparatus or the like, halogen-based corrosive gas can be prevented from flowing into the interior of the constituent member. Thus, the sintered body of the present invention has high corrosion resistance against halogen-based corrosive gas. Such a constituent member having high properties for blocking halogen-based corrosive gas in this manner is preferably used as, for example, vacuum chamber constituent members, etching gas supply ports, focus rings, wafer holders, and the like of etching apparatuses. From the viewpoint of making the sintered body of the present invention more dense, the sintered body has a relative density of preferably 70% or more, more preferably 80% or more, even more preferably 90% or more, and particularly preferably 95% or more. The higher the relative density (RD), the more preferable it is, and the upper limit thereof is 100%. From the viewpoint of improving the corrosion resistance, the smaller the porosity, in particular, the open porosity (OP), the more preferable it is. The open porosity can be obtained using the method described below, and it is preferably 10% or less, more preferably 2% or less, and particularly preferably 0.5% or less. The sintered body having such a relative density (RD) and such an open porosity (OP) can be obtained by adjusting temperature conditions and pressure conditions in the manufacture of the sintered body of the present invention using a manufacturing method (1) or (2) described later.

The relative density (RD) and the open porosity in this specification can be measured as defined in JIS R1634 using the Archimedean method, specifically as follows.

Method for Measuring Relative Density (RD) and Open Porosity (OP)

A sintered body is placed in distilled water and held for one hour under reduced pressure using a diaphragm vacuum pump, after which an underwater weight $W_2$ [g] is measured. Then, excessive moisture is removed with a wet cloth, and a water-saturated weight $W_3$ [g] is measured. Subsequently, the sintered body is placed in a drier and sufficiently dried, after which a dry weight $W_1$ [g] is measured. The bulk density $\rho_b$ [g/cm$^3$] and the open porosity OP are calculated using the following equations.

$$\rho_b = W_1/(W_3-W_2) \times \rho_1 \ (g/cm^3)$$

$$OP = (W_3-W_1)/(W_3-W_2) \times 100 (\%)$$

where $\rho_1$ [g/cm$^3$] is the density of distilled water. The obtained bulk density $\rho_b$ and theoretical density $\rho_c$ [g/cm$^3$] are used to calculate the relative density (RD) [%] using the following equation.

$$RD = \rho_b/\rho_c \times 100 (\%)$$

Furthermore, the sintered body of the present invention has a three-point bending strength $\sigma_f$ that is preferably as high as a certain level or more. Specifically, the three-point bending strength $\sigma_f$ of the sintered body of the present invention is preferably 10 MPa or more, more preferably 20 MPa or more, even more preferably 50 MPa or more, and particularly preferably 100 MPa or more. The higher the three-point bending strength $\sigma_f$, the more preferable it is from the viewpoint of achieving high strength as a material for forming a semiconductor manufacturing apparatus, but the upper limit thereof is preferably 300 MPa or less from the viewpoint of easiness and the like in manufacturing the sintered body. The sintered body having such strength can be obtained by manufacturing the sintered body of the present invention using a manufacturing method (1) or (2) described later.

The three-point bending strength $\sigma_f$ is measured using the following method.

Method for Measuring Three-Point Bending Strength $\sigma_f$

A sintered body is cut and one face thereof is mirror-polished, so that strip-like test pieces each having a thickness of 1.5 to 3.0 mm, a width of about 4 mm, and a length of about 35 mm are obtained. The test pieces are placed on a SiC jig and subjected to a three-point bending test using a universal testing machine (1185, manufactured by Instron). The conditions are set such that the distance between fulcrums is 30 mm, the crosshead speed is 0.5 mm/min, and the number of test pieces is five. The bending strength $\sigma_f$ [MPa] is calculated as defined in JIS R1601 using the following equation.

$$\sigma_f = (3 \times P_f \times L)/(2 \times w \times t^2) \ (MPa)$$

where $P_f$ is the load [N] when a test piece is broken, L is the span distance [mm], w is the width [mm] of the test piece, and t is the thickness [mm] of the test piece.

Furthermore, the sintered body of the present invention has a modulus of elasticity of preferably 25 GPa or more and 300 GPa or less, more preferably 50 GPa or more and 300 GPa or less, even more preferably 100 GPa or more and 250 GPa or less, and most preferably 150 GPa or more and 200 GPa or less. If the modulus of elasticity is in such a range, the sintered body has high durability as a material for forming a semiconductor manufacturing apparatus, and exhibits excellent resistance against halogen-based plasma. Examples of the methods for achieving such a modulus of elasticity include a method in which the average particle size, the molding method, the pressing method, or the like of the starting material powder is adjusted in the sintered body manufacturing method described later.

Method for Measuring Modulus of Elasticity

The modulus of elasticity can be measured as defined in JIS R1602 using the following method.

In the measurement, an oscilloscope (WJ312A, manufactured by LeCroy) and a pulser/receiver (5072PR, manufactured by Olympus NDT) are used. A longitudinal wave oscillator (V110, 5 MHz) and a transverse wave oscillator (V156, 5 MHz) are fixed to test pieces using an adhesive (for longitudinal waves: Couplant B Glycerin (manufactured by Olympus), and for transverse waves: Sonicoat SHN-B25 (manufactured by Nichigo Nikko)), and the longitudinal wave velocity $V_l$ [m/s] and the transverse wave velocity $V_t$ [m/s] are measured from the pulse propagation velocity. The modulus of elasticity E [GPa] is calculated from the obtained $V_l$ and $V_t$, and the bulk density $\rho_b$ [kg/mm$^3$] of the test pieces using the following equation.

$$E=\rho_b \cdot (V_t^2 \cdot V_l^2 - 4V_t^4)/(V_l^2-V_t^2) \times 10^{-9} \text{ (GPa)}$$

Furthermore, the sintered body of the present invention has a heat conductivity of preferably 5.0 W/(m·K) or more, and more preferably 10.0 W/(m·K) or more. The sintered body having such a high heat conductivity can be preferably used in constituent members required to have uniform heat distribution and constituent members that undergo a significant temperature change. Furthermore, if the sintered body of the present invention is used in constituent members required to have thermal insulation properties, such as gas or electricity introduction terminals of etching apparatuses, the sintered body has a heat conductivity that is as low as preferably 5.0 W/(m·K) or less, and particularly preferably approximately 3.0 W/(m·K) or less. The heat conductivity can be measured as follows.

Method for Measuring Heat Conductivity

Square plate-like samples having a length of each side of 10 mm and a thickness of 1 mm were used. Both faces of each sample were coated with platinum onto which spray containing carbon particles (FC-153, manufactured by Fine Chemical Japan Co., LTD.) was slightly applied. The sample subjected to black oxide treatment was placed on a jig, after which a surface thereof was irradiated with pulses (pulse width 0.33 ms) using a xenon flash lamp, and a change in the temperature at the sample back face was measured, so that the diffusivity of heat a was obtained. The change in the temperature was calculated in the range that was ten times the halftime. Furthermore, alumina was used as a standard sample, and the specific heat capacity C was obtained. The measurement was performed three times in air at a temperature of 25° C. and a humidity of 50%. In the measurement, a thermal constant measuring apparatus (LFA447, manufactured by Netzsch) was used.

The heat conductivity $\lambda$ [W/(m·K)] was obtained as defined in JIS R1611 using the following equation.

$$\lambda = \alpha \times C \times \rho (W/(m \cdot K))$$

where $\alpha$ is the diffusivity of heat [m$^2$/s], C is the specific heat capacity [J/kg·K], and $\rho$ is the bulk density [kg/m$^3$] of a sample.

The sintered body of the present invention may be made of substantially only yttrium oxyfluoride, but may also contain components other than yttrium oxyfluoride. "Substantially" refers to a state in which only unavoidable impurities are contained in addition to oxyfluoride, and specifically refers to a state in which the oxyfluoride content is 98% by mass or more. Examples of such unavoidable impurities include by-products such as yttrium oxide when the manufacture is performed using a method (1) or (2) described later.

Specifically, the sintered body of the present invention has a yttrium oxyfluoride content of 50% by mass or more, from the viewpoint of increasing the plasma resistance effect of the present invention, improving the mechanical strength, and the like. From this viewpoint, the amount of yttrium oxyfluoride in the sintered body is more preferably 80% by mass or more, even more preferably 90% by mass or more, and particularly preferably 98% by mass or more. The higher the yttrium oxyfluoride content in the sintered body, the more preferable it is.

If it is seen from a qualitative analysis that the sintered body of the present invention is made of yttrium oxyfluoride and yttrium oxide, the yttrium oxyfluoride content in the sintered body can be measured using the following method. The qualitative analysis in this case can be performed, for example, by X-ray diffraction measurement.

A powder sample obtained by mixing yttrium oxide and yttrium oxyfluoride at a predetermined ratio is subjected to X-ray diffraction measurement. Among the obtained diffraction peaks, a ratio between the maximum peak intensity of yttrium oxide and the maximum peak intensity yttrium oxyfluoride is obtained and is plotted with respect to the mixing ratio, and thus a calibration curve is generated. A mixing ratio between yttrium oxide and yttrium oxyfluoride is measured with reference to the calibration curve, and the ratio of yttrium oxyfluoride when the total of them is taken as 100 is obtained as the yttrium oxyfluoride content. X-ray diffraction measurement of a sintered body is measurement of the sintered body in a powdered form, and can be performed using a method described in examples described later.

Furthermore, if it is seen from the above-described qualitative analysis that the sintered body contains a material other than yttrium oxyfluoride and yttrium oxide, a mixing ratio between that material and yttrium oxyfluoride may be measured using the above-described method with respect to that material, so that the yttrium oxyfluoride content is obtained.

When the sintered body of the present invention in a powdered form is subjected to X-ray diffraction measurement (scanning range: 2θ=10° to 80°) using CuKα rays or Cu—Kα$_1$ rays, the diffraction peak at the maximum intensity is preferably a peak derived from yttrium oxyfluoride. Furthermore, in this X-ray diffraction measurement, a peak derived from a component other than yttrium oxyfluoride may be observed, but it is preferable that this peak is small or is not observed. For example, when the height of the maximum peak derived from yttrium oxyfluoride in the scanning range is taken as 1, the height of the maximum peak derived from a component other than yttrium oxyfluoride is preferably 0.5 or less, and more preferably 0.05 or less. In particular, in this X-ray diffraction measurement, when the height of the maximum peak derived from yttrium oxyfluoride in the scanning range is taken as 1, the height of the maximum peak derived from YF$_3$ is preferably 0.1 or less, and more preferably 0.03 or less. Furthermore, in this X-ray diffraction measurement, when the height of the maximum peak derived from yttrium oxyfluoride in the scanning range is taken as 1, the height of the maximum peak derived from Y$_2$O$_3$ is preferably 0.2 or less, and more preferably 0.05 or less. X-ray diffraction measurement of a sintered body in a powdered form can be performed using a method described in examples described later. The peak ratio in the sintered body of the present invention can be set within the above-described range by adjusting the ratio of yttrium oxyfluoride in the starting material powder, the temperature and the sintering atmosphere of sintering conditions, or the like.

If the sintered body of the present invention contains YOF, it preferably contains rhombohedral crystals as the YOF, and, if the sintered body of the present invention contains Y$_5$O$_4$F$_7$, it preferably contains orthorhombic crystals as the $Y_5O_4F_7$. These crystal phases can be identified by performing X-ray diffraction measurement on the sintered body surface or powder.

Examples of the components of the sintered body of the present invention other than yttrium oxyfluoride include various sintering aids, binder resins, carbon, and the like. Furthermore, the sintered body of the present invention may contain, in addition to yttrium oxyfluoride, various ceramic materials such as conventionally used aluminum oxide, yttrium oxide, aluminum yttrium complex oxide, yttrium fluoride, and compounds containing rare earth elements other than yttrium.

The sintered body of the present invention is a sintered body containing yttrium oxyfluoride, and thus it has excellent resistance against halogen-based plasma compared with sintered bodies of other ceramic materials, and, furthermore, it has excellent denseness and excellent properties for blocking halogen-based corrosive gas compared with conventional thermal spray materials containing yttrium oxyfluoride.

Next, a preferable method for manufacturing the sintered body of the present invention will be described. Examples of the method for manufacturing the sintered body of the present invention include the method (1) below:

a method (1) for manufacturing a sintered body, including:

a step of obtaining a compact of a starting material powder containing yttrium oxyfluoride; and a step of sintering the compact under a pressure of 5 MPa or more and 100 MPa or less at a temperature of 800° C. or more and 1800° C. or less, thereby obtaining the sintered body.

First, the method (1) will be described.

In the method (1), the step of obtaining a compact and the step of sintering the compact may be simultaneously performed. For example, the method (1) may also be a method including placing a powder sample in a mold, and sintering it under pressure without any further treatment.

The yttrium oxyfluoride in the starting material powder containing yttrium oxyfluoride may be similar to the yttrium oxyfluoride contained in the sintered body. The yttrium oxyfluoride used in the starting material is typically in a powder form. The yttrium oxyfluoride contained in the starting material powder has an average particle size of preferably 5 µm or less, more preferably 1.5 µm or less, even more preferably 1.1 µm or less, and particularly preferably 1 µm or less. The average particle size is 50% diameter in the volume-based cumulative fraction (hereinafter, alternatively referred to simply as "D50"), and is measured using a laser diffraction scattering-type particle size distribution measurement method. A specific measuring method is as follows. The preferable average particle size of the starting material powder may be similar to the average particle size of the yttrium oxyfluoride contained in the starting material powder.

Method for Measuring Average Particle Size

The measurement is performed using a Microtrac HRA manufactured by Nikkiso Co., Ltd. At the time of the measurement, 2% by mass of sodium hexametaphosphate aqueous solution is used as a dispersion medium, and a sample (granules) is added to a chamber of a sample circulating unit of the Microtrac HRA until the apparatus determines that the concentration has reached a proper concentration.

The starting material powder may contain, in addition to yttrium oxyfluoride, other components such as sintering aids and binders described above, but the amount of other components such as sintering aids and binder resins in the sintered body of the present invention is preferably small. In particular, in the starting material powder, the amount of sintering aids is preferably 5% by mass or less, and more preferably 2% by mass or less. In one aspect, the manufacturing method of the present invention is characterized by the fact that a dense sintered body is obtained even when no sintering aid is used or the amount of sintering aid used is small to the extent possible. Examples of the sintering aids include $SiO_2$, MgO, CaO, various rare earth oxides, and the like. Examples of the methods for molding the starting material powder include mold pressing, rubber pressing (isostatic pressing), sheet molding, extrusion molding, cast molding, and the like. In the case of sintering with no application of pressure, it is preferable that the material is pressed by performing uniaxial pressing in an oil hydraulic pressing machine or the like, and is then subjected to isostatic pressing, so that molding is performed. In this case, the uniaxial pressing is performed at a pressure of preferably 20 MPa or more and 85 MPa or less, and more preferably 22 MPa or more and 75 MPa or less. Furthermore, the isostatic pressing is performed at a pressure of preferably 85 MPa or more and 250 MPa or less, and more preferably 100 MPa or more and 220 MPa or less. In the case of sintering with the application of pressure, it is preferable that the material is molded with the application of pressure by performing uniaxial pressing in an oil hydraulic pressing machine or the like, and is then subjected to sintering with the application of pressure. In this case, the uniaxial pressing is performed at a pressure of preferably 10 MPa or more and 100 MPa or less, and more preferably 15 MPa or more and 80 MPa or less. In the starting material powder, the yttrium oxyfluoride content is preferably 80% by mass or more, more preferably 95% by mass or more, and particularly preferably 98% by mass or more.

In the method (1), the thus obtained compact is sintered with the application of pressure. Examples of specific methods for performing sintering with the application of pressure include hot pressing, spark plasma sintering (SPS), and hot isostatic pressing (HIP). The sintering with the application of pressure is performed at a pressure of preferably 5 MPa or more and 100 MPa or less. Setting the pressure to 5 MPa or more is advantageous in that a dense sintered body having high plasma resistance can be easily obtained, and setting the pressure to 100 MPa or less is advantageous in that damage to the pressing mold is suppressed, for example. From these viewpoints, the sintering with the application of pressure is performed at a pressure of preferably 20 MPa or more, and more preferably 100 MPa or less. The sintering temperature is preferably 800° C. or more and 1800° C. or less. Setting the sintering temperature to 800° C. or more is advantageous in that densification is likely to progress, decomposition and evaporation of added binders progress, and reaction of unreacted components contained in the starting material progresses to generate oxyfluoride, for example. Setting the sintering temperature to 1800° C. or less is advantageous in that decomposition of oxyfluoride is suppressed, and damage to the pressure-sintering device is suppressed, for example. From these viewpoints, the sintering temperature is more preferably 1000° C. or more and 1700° C. or less.

Furthermore, the pressure-sintering time at the above-mentioned pressure and temperature (holding time at the maximum temperature) is preferably 0 hours or more and 6 hours or less, and more preferably 20 minutes or more and 2 hours or less.

In particular, in the case of hot pressing, the sintering with the application of pressure is performed at a pressure of preferably 30 MPa or more and 50 MPa or less, and at a sintering temperature of preferably 1300° C. or more and 1700° C. or less. Furthermore, in the case of spark plasma sintering, the sintering with the application of pressure is performed at a pressure of preferably 30 MPa or more and 100 MPa or less, and at a sintering temperature of more preferably 1000° C. or more and 1500° C. or less.

The sintered body of the present invention can also be manufactured using, instead of the method (1), the method (2) below:

a method (2) for manufacturing a sintered body, including:

a step of obtaining a compact of a starting material powder containing yttrium oxyfluoride; and a step of sintering the compact with no application of pressure at a temperature of 1000° C. or more and 2000° C. or less.

The method (2) is different from the method (1) in that sintering with no application of pressure is performed, but the step of obtaining a compact of a starting material powder is as in the method (1).

Setting the sintering temperature to 1000° C. or more is preferable from the viewpoint of obtaining a dense sintered body and removing organic matter mixed in, and setting the sintering temperature to 2000° C. or less is preferable from the viewpoint of suppressing decomposition of oxyfluoride and suppressing damage to the pressure-sintering device, for example. From these viewpoints, the sintering temperature is more preferably 1200° C. or more and 1800° C. or less. Furthermore, the sintering time at the above-described sintering temperature (holding time at the maximum temperature) is preferably 0 hours or more and 24 hours or less, and more preferably 0 hours or more and 6 hours or less. With this manufacturing method, a sufficiently dense sintered body can be obtained by sintering the above-described starting material powder at the above-described temperature even when the sintering is performed with no application of pressure.

The sintering using either method (1) or (2) may be performed in an oxygen-containing atmosphere or in an inert atmosphere. However, the sintering is preferably performed in an inert atmosphere from the viewpoint of preventing yttrium oxide from being generated. Examples of the oxygen-containing atmosphere include air, and examples of the inert atmosphere include rare gas such as argon, nitrogen, vacuum, and the like. In the sintering using either method (1) or (2), the temperature is increased and decreased preferably at 0.5° C./min or more and 40° C./min or less up to 1200° C. and is increased and decreased preferably at 1° C./min or more and 30° C./min or less in a temperature range of 1200° C. or more.

The thus obtained sintered body can be used in constituent members of semiconductor manufacturing apparatuses, such as vacuum chambers, sample stages and chucks in the chambers, focus rings, etching gas supply ports, and the like of etching apparatuses. Furthermore, the sintered body of the present invention can be used not only in such constituent members of semiconductor manufacturing apparatuses, but also in constituent members of various plasma treatment apparatuses and chemical plants.

EXAMPLES

Hereinafter, the present invention will be described in more detail by way of examples. However, the scope of the present invention is not limited to these examples.

Example 1: Manufacture of YOF-Containing Sintered Body by Sintering with No Application of Pressure About 1.4 g of YOF powder (average particle size 0.8 μm) was placed in a circular mold having a diameter of 15 mm, and was subjected to primary molding by performing uniaxial pressing at a pressure of 25.5 MPa in an oil hydraulic pressing machine and holding the state for 1 minute. The obtained primary-molded material was isostatically molded by applying a pressure of 200 MPa and holding the state for 1 minute. The obtained material was placed in a crucible made of alumina, and a dusting powder was applied thereto, on which the compact was placed, and a lid was closed. Furthermore, the entire crucible was placed in a large crucible made of carbon. In an Ar flow (flow rate 2 liter/min), the temperature was increased at 30° C./min to 1200° C., and was further increased at 10° C./min to 1600° C., and, after the temperature was kept at 1600° C. for one hour, the temperature was decreased at 10° C./min to 1200° C., and was further decreased at 30° C./min. Accordingly, a sintered body was obtained. Measurement using the above-described method showed that the obtained sintered body had a relative density RD of 96% and an open porosity of 0.2%. The XRD of powder of the obtained sintered body was measured using the method below. The obtained X-ray chart is shown in FIG. 1. As shown in FIG. 1, in this X-ray chart, only a peak that seems to be derived from YOF is observed and no peak derived from a component other than YOF is observed, and only YOF was used as a starting material powder, and thus this sintered body seems to contain substantially 100% by mass of YOF. Measurement using the above-described method showed that the actually obtained sintered body had a yttrium oxyfluoride content of 100% by mass.

XRD Measurement of Sintered Body Powder

Part of the sintered body was pulverized using a porcelain mortar and pestle to form a powder, this power was set in a glass holder, and XRD measurement was performed. The XRD measurement conditions were as follows: continuous scanning, Cu targeted, bulb voltage 40 kV, bulb current 30 mA, scanning range 2θ=10° to 80°, and scanning speed 0.050° 2θ/s. Kβ rays were removed by a curved graphite filter.

Figure 2:
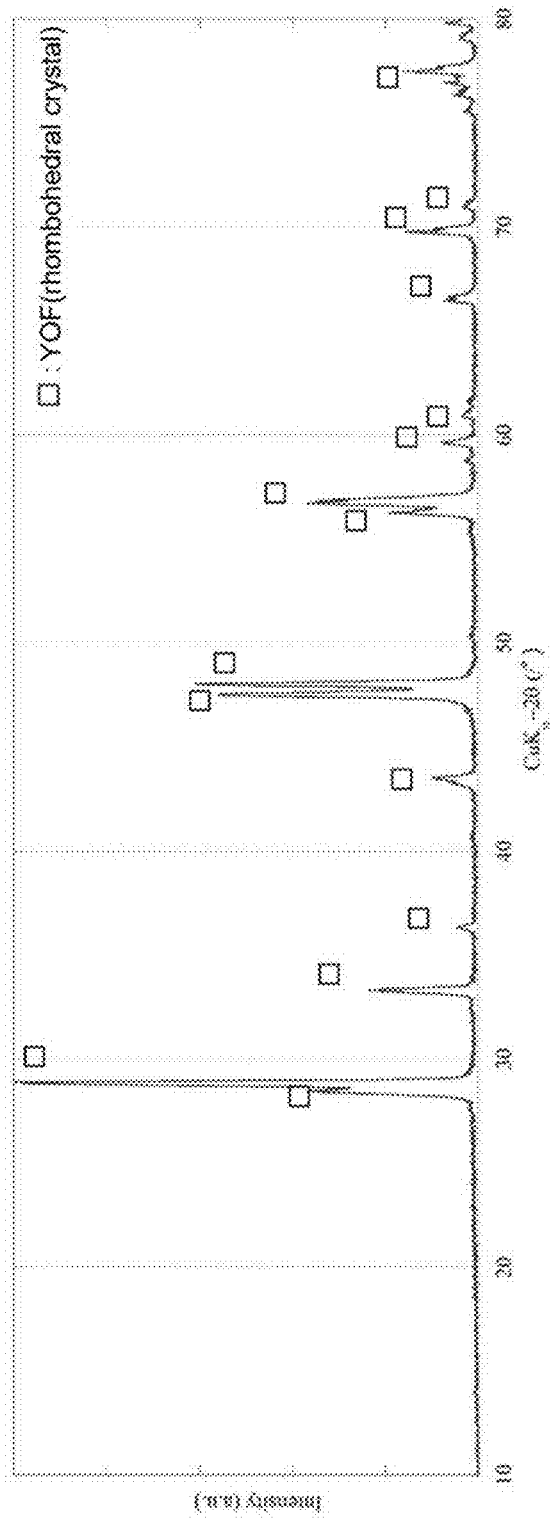
FIG. 2 is an X-ray chart obtained by powder XRD diffraction measurement of a sintered body obtained in Example 2.

Example 2: Manufacture of YOF-Containing Sintered Body by Sintering with the Application of Pressure About 20 g of YOF powder (average particle size 0.8 μm) was placed in a rectangular mold having a depth of 35 mm and a width of 35 mm, and was subjected to primary molding at a pressure of 18.4 MPa in an oil hydraulic pressing machine. The obtained material was placed in a hot pressing mold made of carbon having the same size as the above-mentioned quadrangular mold, and was sintered by hot pressing. In an Ar flow (flow rate 2 liter/min), the temperature was increased at 30° C./min to 1200° C., and was further increased at 10° C./min to 1600° C., and, after the temperature was kept at 1600° C. for one hour, the temperature was decreased at 10° C./min to 1200° C., and was further decreased at 30° C./min. When held at 1600° C. for one hour, the material was uniaxially pressed at a pressure of 36.7 MPa. Accordingly, a sintered body was obtained. Measurement using the above-described method showed that the actually obtained sintered body had a relative density RD of 99.5% and an open porosity of 0.1%. Furthermore, measurement using the above-described method showed that the sintered body had a three-point bending strength of 120 MPa. Measurement using the above-described method showed that the sintered body had a modulus of elasticity of 183 GPa and a heat conductivity of 17 W/(m·K). The XRD of powder of the obtained sintered body was measured as in Example 1. The obtained X-ray chart is shown in FIG. 2. As shown in FIG. 2, in this X-ray chart, only a peak that seems to be derived from YOF is observed and no peak derived from a component other than YOF is observed, and only YOF was used as a starting material powder, and thus this sintered body seems to contain 100% by mass of YOF. Measurement using the above-described method showed that the obtained sintered body had a yttrium oxyfluoride content of 100% by mass.

Figure 3:
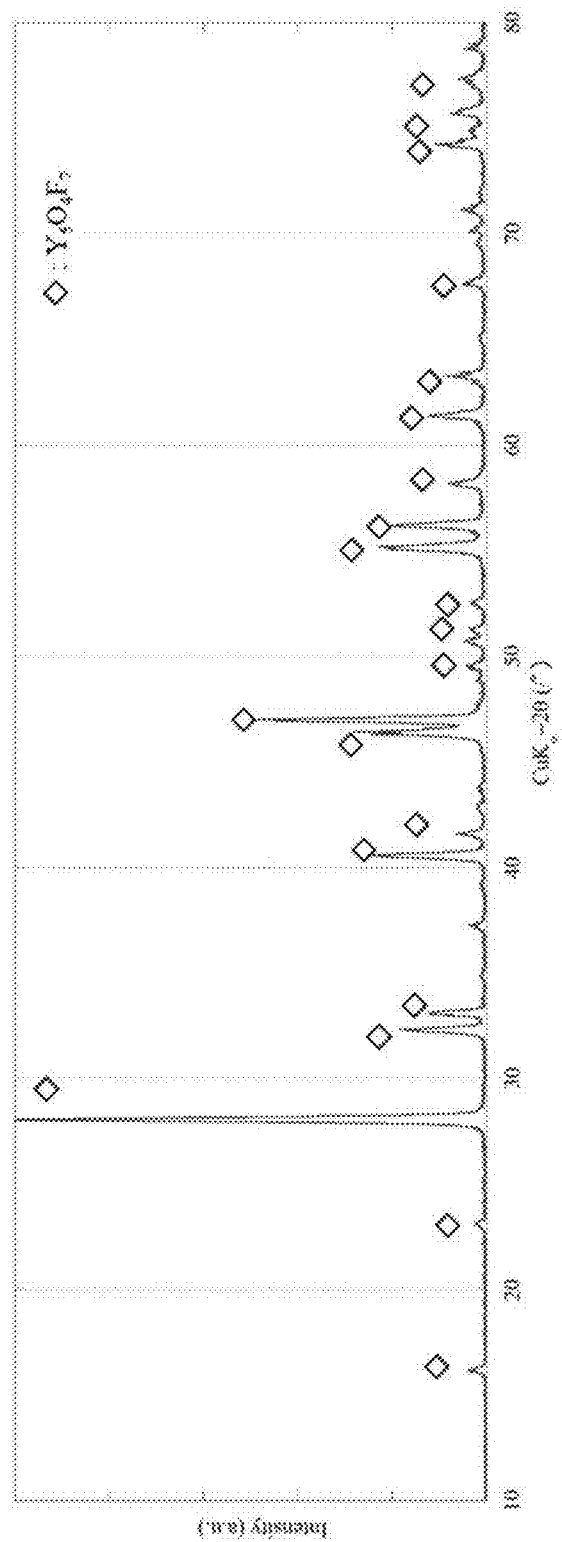
FIG. 3 is an X-ray chart obtained by powder XRD diffraction measurement of a sintered body obtained in Example 3.

Example 3: Manufacture of $Y_5O_4F_7$-Containing Sintered Body by Sintering with No Application of Pressure About 1.4 g of $Y_5O_4F_7$ powder (average particle size 1.1 µm) was placed in a circular mold having a diameter of 15 mm, and was subjected to primary molding by performing uniaxial pressing at a pressure of 25.5 MPa in an oil hydraulic pressing machine and holding the state for 1 minute. The obtained primary-molded material was isostatically molded by applying a pressure of 200 MPa and holding the state for 1 minute. The obtained material was placed in a crucible made of alumina, and a dusting powder was applied thereto, on which the compact was placed, and a lid was closed. Furthermore, the entire crucible was placed in a large crucible made of carbon. In an Ar flow (flow rate 2 liter/min), the temperature was increased at 30° C./min to 1200° C., and was further increased at 10° C./min to 1400° C., after which the temperature was decreased at 10° C./min to 1200° C., and was further decreased at 30° C./min. Accordingly, a sintered body was obtained. The holding time at 1400° C. was 0 hours. Measurement using the above-described method showed that the obtained sintered body had a relative density RD of 99.6% and an open porosity of 0.1%. Furthermore, the XRD of powder of the obtained sintered body was measured as in Example 1. The obtained X-ray chart is shown in FIG. 3. As shown in FIG. 3, in this X-ray chart, a peak that seems to be derived from $Y_5O_4F_7$ is mainly observed and a peak derived from a component other than $Y_5O_4F_7$ is observed only extremely slightly, and only $Y_5O_4F_7$ was used as starting material powder, and thus this sintered body seems to contain 95% by mass or more of $Y_5O_4F_7$.

Figure 4:
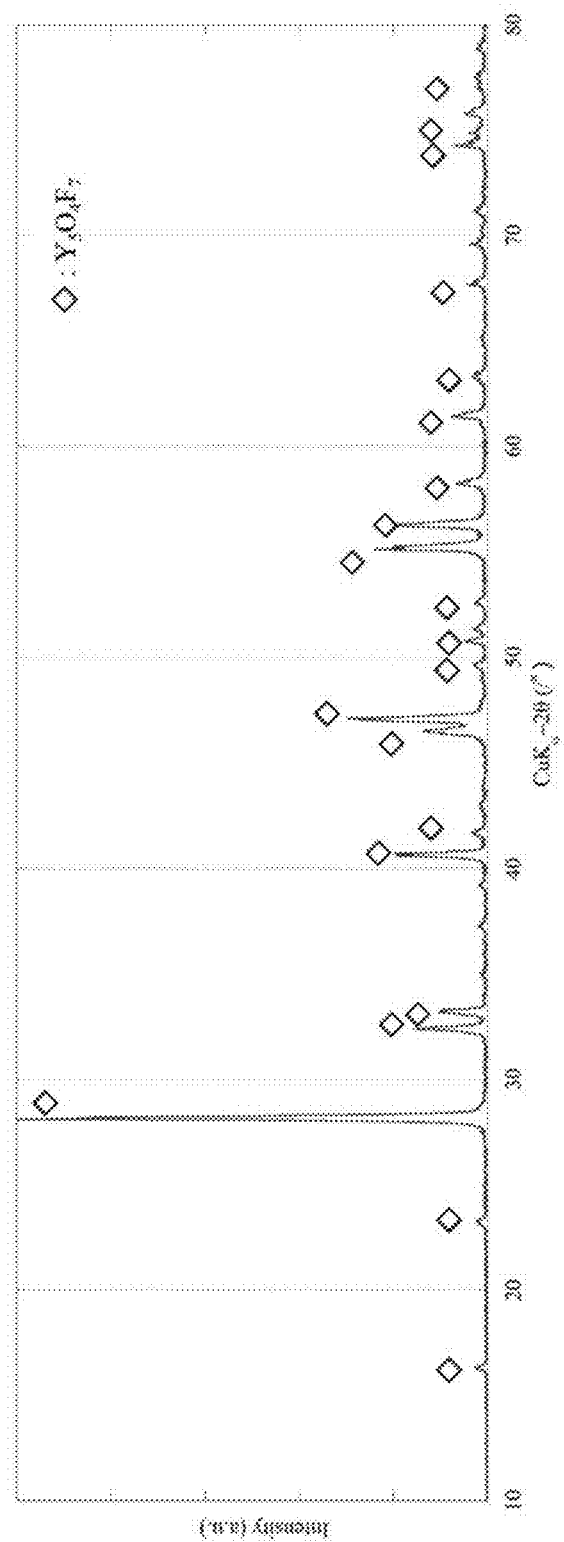
FIG. 4 is an X-ray chart obtained by powder XRD diffraction measurement of a sintered body obtained in Example 4.

Example 4: Manufacture of $Y_5O_4F_7$-Containing Sintered Body by Sintering with the Application of Pressure About 20 g of $Y_5O_4F_7$ powder (average particle size 1.1 µm) was placed in a rectangular mold having a depth of 35 mm and a width of 35 mm, and was subjected to primary molding at a pressure of 18.4 MPa in an oil hydraulic pressing machine. The obtained material was placed in a hot pressing mold made of carbon having the same size as the above-mentioned quadrangular mold, and was sintered by hot pressing. In an Ar flow (flow rate 2 liter/min), the temperature was increased at 30° C./min to 1200° C., and was further increased at 10° C./min to 1400° C., after which the temperature was decreased at 10° C./min to 1200° C., and was further decreased at 30° C./min. The holding time at 1400° C. was 0 hours. When the temperature was 1200° C. or more, the material was uniaxially pressed at 36.7 MPa. Accordingly, a sintered body was obtained. Measurement using the above-described method showed that the obtained sintered body had a relative density RD of 99.8% and an open porosity of 0.1%. Furthermore, measurement using the above-described method showed that the obtained sintered body had a three-point bending strength of 26 MPa. Measurement using the above-described method showed that the sintered body had a modulus of elasticity of 157 GPa and a heat conductivity of 2.9 W/(m·K). Furthermore, the XRD of powder of the obtained sintered body was measured as in Example 1. The obtained X-ray chart is shown in FIG. 4. As shown in FIG. 4, in this X-ray chart, a peak that seems to be derived from $Y_5O_4F_7$ is mainly observed and a peak derived from a component other than $Y_5O_4F_7$ is observed only extremely slightly, and only $Y_5O_4F_7$ was used as starting material powder, and thus this sintered body seems to contain 95% by mass or more of $Y_5O_4F_7$.

Example 5: Manufacture of YOF-Containing Sintered Body by Sintering with No Application of Pressure A sintered body having a relative density RD of 87% and an open porosity of 0.2% was obtained as in Example 1, except that the sintering was performed in an air atmosphere instead of an Ar atmosphere and the holding time at 1600° C. was set to two hours instead of one hour. A result of XRD measurement showed that this sintered body contained a large amount of $Y_2O_3$ in addition to YOF.

Comparative Example 1

Single crystal silicon (Si) was used.

Comparative Example 2

An alumina ($Al_2O_3$) sintered body was used.

Comparative Example 3

A yttria ($Y_2O_3$) sintered body was used.

Comparative Example 4

A yttrium fluoride ($YF_3$) sintered body was used.

The plasma resistances of the sintered body obtained in Example 2, the single crystal of Comparative Example 1, and the sintered bodies of Comparative Examples 2 to 4 were evaluated by performing SEM observation (S-4800, Hitachi High-Technologies Corporation) as described in Evaluation 1 below.

Evaluation 1

A plasma treatment apparatus (PT7160, Elminet Inc.) was used to irradiate, with $CF_4+O_2$ plasma, the surfaces of the sintered body obtained in Example 2, the single crystal of Comparative Example 1, and the sintered bodies of Comparative Examples 2 to 4. The samples were held for 30 minutes with scale settings of CF$_4$ 0.8 and O$_2$ 0.2 and an intensity of 100 W.

The solid surfaces of Example 2 and Comparative Examples 1 to 4 before and after plasma irradiation were observed using a scanning electron microscope (SEM). SEM photographs obtained by capturing image of the solid surfaces are shown in FIGS. 5 to 9. In FIGS. 5 to 9, upper photographs are SEM photographs before irradiation, and lower photographs are SEM photographs after irradiation.

Figure 7:
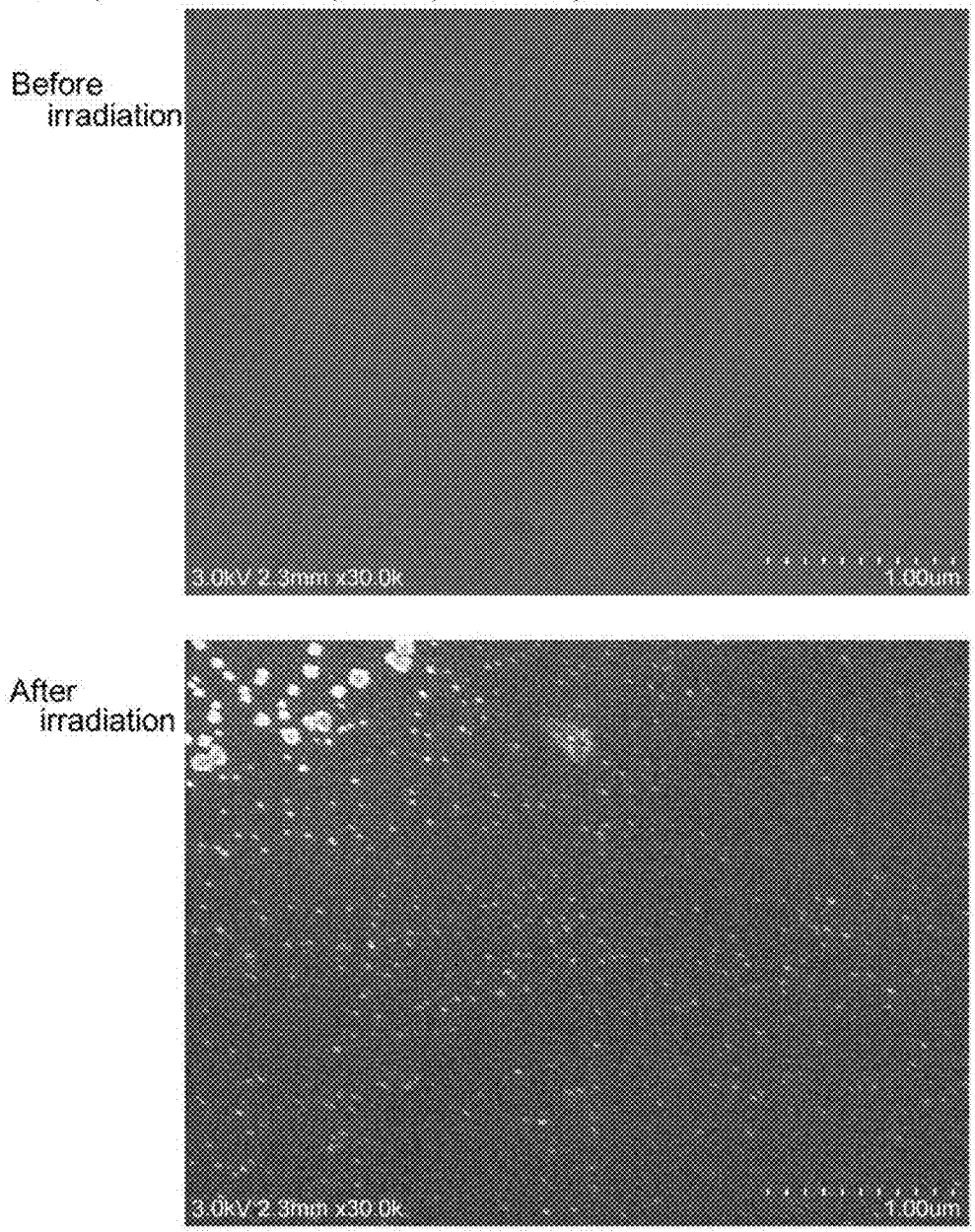
FIG. 7 shows SEM photographs before and after plasma irradiation on alumina of Comparative Example 2.
Figure 9:
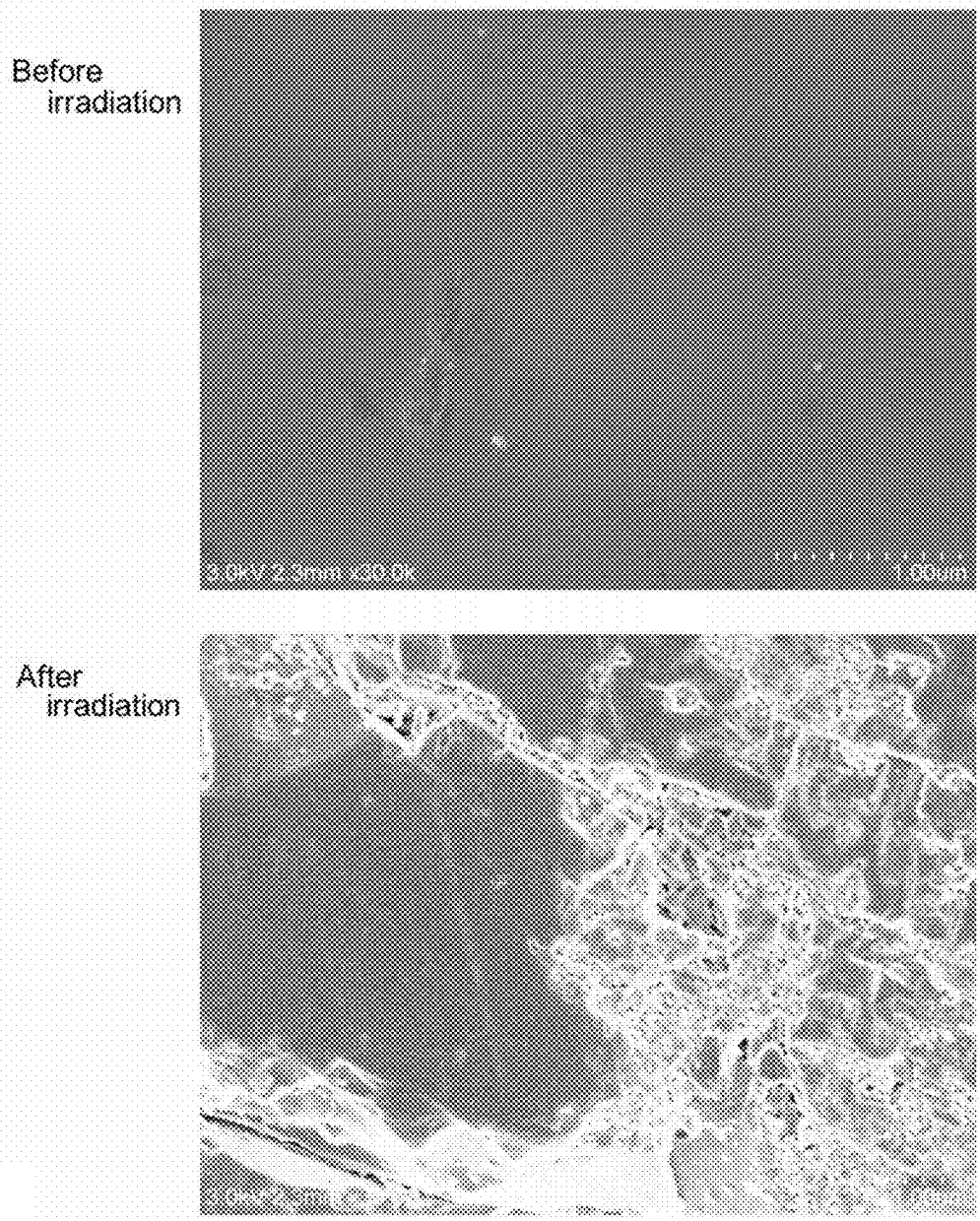
FIG. 9 shows SEM photographs before and after plasma irradiation on yttrium fluoride of Comparative Example 4.

As shown in FIG. 5, it was seen from observation of yttrium oxyfluoride of Example 2 that there was almost no change before and after irradiation. On the other hand, as shown in FIG. 6, it was seen from observation of silicon of Comparative Example 1 that the surface was flat before irradiation but it was rough after irradiation. As shown in FIG. 7, it was seen from observation of alumina of Comparative Example 2 that a large number of white particles, which were not seen before irradiation, were generated after irradiation. As shown in FIG. 8, it was seen from observation of yttria of Comparative Example 3 that there was not so much change before and after irradiation. As shown in FIG. 9, it was seen from observation of yttrium fluoride of Comparative Example 4 that a large number of cracks occurred after irradiation.

As described above, SEM observation of the sintered body surfaces showed that the yttrium oxyfluoride sintered body of Example 2 and the yttria sintered body of Comparative Example 3 have higher resistance against halogen-based plasma than the other sintered bodies and single crystal.

Next, the plasma resistances of the samples before and after plasma irradiation obtained in Evaluation 1 were further evaluated according to an evaluation method described in Evaluation 2 below.

Evaluation 2

Figure 10:
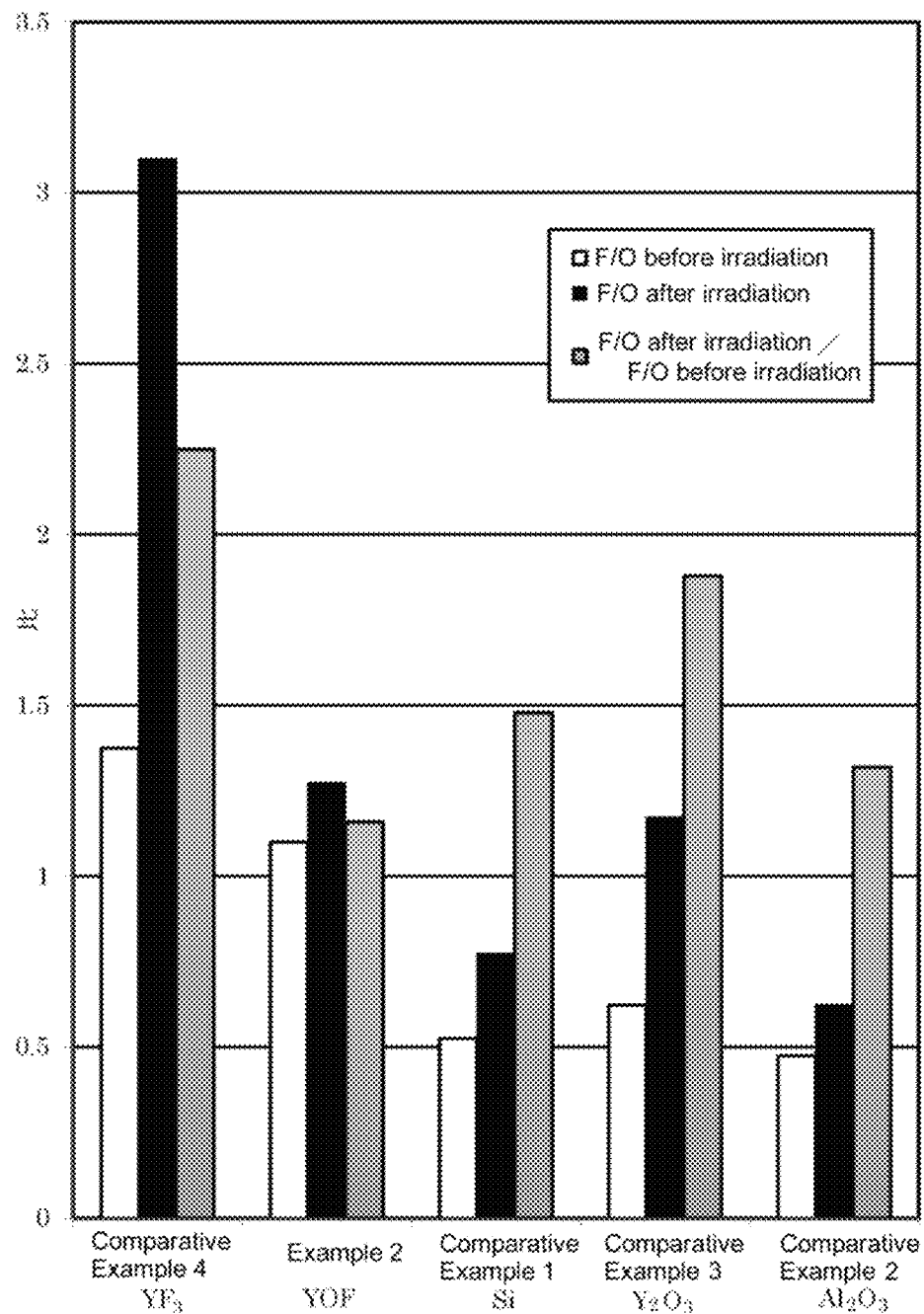
FIG. 10 is a graph showing a change in the F/O ratio before and after plasma irradiation on the sample surfaces of examples and comparative examples.

EDX analysis was performed on the sample surfaces using a device attached to a scanning electron microscope (S-4800, Hitachi High-Technologies Corporation). Measurement was performed by setting the magnification to 5000-fold, and changing the acceleration voltage to 1 kV, 3 kV, 10 kV, and 30 kV, and a change in an atom mass concentration $C_i$ with respect to an electron penetration depth R was obtained using the equation below according to the ZAF method. Furthermore, from the obtained relationship, F atom and O atom mass concentrations were obtained from the portion from the sample surfaces to an electron penetration depth of 0.1 μm (100 nm). The F/O atom ratio in this portion was obtained from the obtained concentrations. FIG. 10 is a graph showing the F/O atom ratio before plasma irradiation (F/O before irradiation), the F/O atom ratio after plasma irradiation (F/O after irradiation), and the amount of change in the F/O atom ratio before and after plasma irradiation (F/O after irradiation/F/O before irradiation). In the equation below, ρ is the density, A is the atomic weight, $E_0$ is the acceleration voltage, and $\lambda_0$ is 0.182. Z is the mean atomic number, and is expressed by $Z=\Sigma C_i Z_i$ when the atomic number of each element is taken as $Z_i$ and the mass concentration is taken as $C_i$.

$$\rho R = 5.025 \frac{A E_0^{\frac{5}{3}}}{\lambda_0 Z^{\frac{8}{9}}}$$ [Math. 1]

As shown in FIG. 10, the F/O ratios of the samples of silicon (Si), alumina (Al$_2$O$_3$), yttria (Y$_2$O$_3$), and yttrium fluoride (YF$_3$) of the comparative examples were significantly increased by fluorine-based plasma irradiation. That is to say, F element penetration through the surfaces of these samples was seen. In particular, in the case of yttria (Y$_2$O$_3$) of Comparative Example 3, the F/O ratio after irradiation was slightly less than twice the ratio before irradiation, and, in the case of yttrium fluoride (YF$_3$) of Comparative Example 4, the F/O ratio after irradiation was slightly more than twice the ratio before irradiation, and it was seen that the amount of fluorine on the sintered body surfaces was significantly increased by fluorine-based plasma irradiation. On the other hand, in the case of the yttrium oxyfluoride sample of Example 2, the increase in the F/O ratio by plasma irradiation was extremely small, and almost no change was seen. Accordingly, it seems that yttrium oxyfluoride has the highest stability against fluorine-containing plasma.

The plasma resistances of the yttria sample of Comparative Example 3 and the yttrium oxyfluoride sample of Example 1, among the samples after plasma irradiation obtained in Evaluation 1, were further evaluated according to an evaluation method described in Evaluation 3 below.

Evaluation 3

Platinum was vapor-deposited as a mark on the sample surfaces after plasma irradiation, after which the surfaces were perpendicularly irradiated with Ar ions using a Hitachi ion milling device IM4000, so that samples for cross-sectional observation were formed. These samples for cross-sectional observation were observed using a high-sensitive EDX-attached scanning electron microscope (SU-8200, Hitachi High-Technologies Corporation), so that SEM photographs were obtained, and atomic distribution maps of oxygen, fluorine, platinum, and yttrium were obtained. FIG. 11 shows a cross-sectional SEM photograph and atomic distribution maps of the sintered body of Example 2, and FIG. 12 shows a cross-sectional SEM photograph and atomic distribution maps of the sintered body of Comparative Example 3. In both FIGS. 11 and 12, the upper left portion shows an SEM photograph, the upper right portion shows a fluorine atomic distribution map, the lower right portion shows a platinum atomic distribution map, and the lower left portion shows a map obtained by overlaying the platinum atomic distribution map on the fluorine atomic distribution map.

In the SEM images on the upper left in FIGS. 11 and 12, a band-like line extending in the upper-lower direction is a platinum coating layer, and the portion on the left side thereof shows the sample. The portion on the right side of the platinum layer shows a redeposition layer formed during the ion milling, and is not the sample itself. That is to say, the sample surface is shown on the immediately left side of the platinum. Since the sintered body of the present invention is made of YOF, it originally contains fluorine element. Thus, in FIG. 11, in the fluorine atomic distribution map on the upper right, a grey portion indicating the portion having fluorine atoms and located at the portion other than a black portion corresponding to the platinum layer expands to the entire left side of the black portion corresponding to the platinum. That is to say, according to the fluorine atomic distribution map in FIG. 11, fluorine is uniformly distributed regardless of the depth from the surface. This fact can be seen also in the map obtained by overlaying the platinum atomic distribution map on the fluorine atomic distribution map on the lower left in FIG. 11, and accumulation of fluorine atoms was not seen on the sample surface. That is to say, the influence of fluorine plasma was not seen in the sintered body of the present invention.

On the other hand, in the case of the yttria sintered body of Comparative Example 3, although the sintered body originally contains no fluorine, FIG. 12 showing a cross-sectional observation result of the sintered body after plasma irradiation shows that there is a gray portion in the fluorine atomic distribution map on the upper right, that is, there is fluorine in this portion. As clearly seen from the map obtained by overlaying the platinum atomic distribution map on the fluorine atomic distribution map on the lower left in FIG. 12 and the SEM photograph in FIG. 12, the portion having fluorine atoms in the sintered body of Comparative Example 3 is concentrated on the immediately left side of the platinum layer, which corresponds to the range within about 50 nm from the sample surface. That is to say, it is seen that, in the yttria sintered body of Comparative Example 3, fluorine atom penetration through the surface was caused by plasma irradiation.

It is clear from the results of Evaluations 1 to 3 in combination that the sintered body of the present invention has higher corrosion resistance against halogen-based plasma than the materials of Comparative Examples 1 to 4. Thus, it is clear that the sintered body of the present invention is useful as a member forming a semiconductor manufacturing apparatus such as an etching apparatus.

The invention claimed is:

1. A sintered body containing 50% by mass or more of yttrium oxyfluoride,
   the sintered body having a modulus of elasticity of 100 GPa or more and 300 GPa or less.

2. The sintered body according to claim 1, wherein the yttrium oxyfluoride is YOF.

3. The sintered body according to claim 1, wherein the yttrium oxyfluoride is $Y_5O_4F_7$.

4. The sintered body according to claim 1, having a relative density of 70% or more.

5. The sintered body according to claim 1, having an open porosity of 10% or less.

6. The sintered body according to claim 1, having a three-point bending strength of 10 MPa or more and 300 MPa or less.

7. A method for manufacturing the sintered body according to claim 1, comprising:
   a step of obtaining a compact by pressing, in an oil hydraulic pressing machine, a starting material powder containing a powder of yttrium oxyfluoride having an average particle size of 1.1 μm or less; and
   a step of sintering the compact under a pressure of 5 MPa or more and 100 MPa or less at a temperature of 800° C. or more and 1800° C. or less, thereby obtaining the sintered body.

8. A method for manufacturing the sintered body according to claim 1, comprising:
   a step of obtaining a compact by pressing, in an oil hydraulic pressing machine, a starting material powder containing a powder of yttrium oxyfluoride having an average particle size of 1.1 μm or less to obtain a molded material, and by isostatically pressing the molded material; and
   a step of sintering the compact with no application of pressure at a temperature of 1000° C. or more and 2000° C. or less.

* * * * *